(12) United States Patent
Palenius et al.

(10) Patent No.: US 6,337,876 B1
(45) Date of Patent: Jan. 8, 2002

(54) CONTROL OF POWER RATIOS FOR IN-PHASE AND QUADRATURE CHANNELS IN A COMMUNICATIONS SYSTEM

(75) Inventors: Torgny Palenius; Håkan Eriksson, both of Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/140,470

(22) Filed: Aug. 26, 1998

(51) Int. Cl.[7] .............................................. H04L 27/30
(52) U.S. Cl. ...................... 375/146; 375/130; 375/135; 375/345; 370/342
(58) Field of Search ................................ 375/146, 130, 375/135, 345; 370/342

(56) References Cited

U.S. PATENT DOCUMENTS

| | | | |
|---|---|---|---|
| 4,535,299 A | | 8/1985 | Streckmann et al. ......... 330/279 |
| 5,544,156 A | * | 8/1996 | Teder et al. ................. 370/342 |
| 5,784,366 A | | 7/1998 | Apelewicz ................... 370/342 |
| 5,784,402 A | | 7/1998 | Feher ........................... 375/130 |
| 5,909,435 A | * | 6/1999 | Apelewicz ................... 370/342 |
| 6,009,091 A | * | 12/1999 | Stewart et al. ............... 370/342 |
| 6,108,369 A | * | 8/2000 | Ovesjo et al. ............... 375/146 |

FOREIGN PATENT DOCUMENTS

EP 0954118 A2 * 3/1999 ........... H04B/7/005

OTHER PUBLICATIONS

Ottosson et al., The Impact of Using Multicode Transmission in the WCDMA System, IEEE, pp. 1550–1554, 1999.*

* cited by examiner

Primary Examiner—Stephen Chin
Assistant Examiner—Shuwang Liu
(74) Attorney, Agent, or Firm—Burns, Doane, Swecker & Mathis, L.L.P.

(57) ABSTRACT

A transmitter in a radiocommunications system such as a Wideband Code Division Multiple Access (WCDMA) communications system transmits one set of data on an in-phase (I-) channel and another set of data on a quadrature (Q-) channel. The transmitter generates a gain signal, $\beta$, and multiplies the digital data associated with the Q-channel by the gain signal, $\beta$. Complexity of the multiplication operation is reduced by limiting the gain signal, $\beta$, to a finite number of values that are exactly representable by a predefined number of bits, such as 4-bit values to the right of a binary radix point. Modulation inaccuracy associated with quantization of $\beta$ can be eliminated by utilizing the same quantized values of $\beta$ in all components within the radiocommunications system.

8 Claims, 4 Drawing Sheets

CONTROL OF POWER RATIOS FOR IN-PHASE AND QUADRATURE CHANNELS IN A COMMUNICATIONS SYSTEM

BACKGROUND

The invention relates to radio communications systems use I/Q-modulation, and more particularly to control of a power ratio between the I- and Q-channels in such a system.

Modulation schemes utilizing In-phase (I) and Quadrature (Q) signal components are known. In some cases, such as uplink transmissions in the IMT20000 Wideband Code Division Multiple Access (WCDMA) radio communications system standard proposed in Europe and Japan, IQ-modulation is used in a manner whereby different data channels are transmitted in the I and Q components (henceforth referred to throughout this disclosure as "I-" and "Q-channels"). In the proposed WCDMA system, the common control channel (PCCH) is transmitted on the Q-channel at a data rate of 16 kilobits per second using a spreading factor of 256, while traffic and dedicated control channel (PDCH) is transmitted on the I-channel at a data rate somewhere between 32 kilobits per second (spreading factor of 128) and 1024 kilobits per second (spreading factor of 4).

The power requirements on each of these I- and Q-channels are of course different from one another. Therefore, before spreading and scrambling are applied, the I- and Q-channels have different power levels. It might first be assumed that the power of the channel will be proportional to the data rate in the channel. However, this is not necessarily the case because there are different quality of service requirements on the different channels. The PCCH channel has pilots that may require a quality of service that differs from that required for the speech or data services multiplexed on the PDCH-channel.

The power levels of the I- and Q-channels are controlled by a common Power Control algorithm. This algorithm increases or decreases the power in order to keep the signal power constant at the receiver. To accomplish this, the algorithm should follow the Rayleigh fading, the lognormal fading and the varying path loss due to the varying distance between the terminal and the base station.

A problem that is encountered derives from the requirement that the terminals in the WCDMA system have a transmitter characterized by good modulation accuracy. To get the exact power difference of, for example, 3 dB between the I and the Q-channels requires that the amplitude ratio in the terminal be $$\beta = \frac{1}{\sqrt{2}} = 0.707.$$

To effect this power ratio, the data samples in the Q-channel are multiplied by the value of β, and the resultant samples are supplied to spreading and complex modulation circuits, along with data samples from the I-channel.

Implementation of this exact power ratio is problematic because representation of the number 0.707 requires many bits that will need to participate in the multiplication that is performed on each sample that is to be transmitted. As is well-known, the computational burden imposed by a multiplication operation is related to the length of the operands involved. Increased computational burden translates not only into longer computational time, but also increased power requirements for performing the computation.

Moreover, when a system, such as the above-described WCDMA system, is designed with the assumption that the values of β may vary continuously, different components in the system (e.g., terminals made by different manufacturers) may introduce different quantization errors when representing β. As a consequence of these mismatches, system performance will be degraded.

SUMMARY

It is therefore an object of the present invention to provide a power ratio control strategy that improves performance compared to conventional techniques.

In accordance with one aspect of the present invention, the foregoing and other objects are achieved in methods and apparatuses for use in a transmitter in a radiocommunications system such as a Wideband Code Division Multiple Access (WCDMA) communications system. The transmitter transmits one set of data on an in-phase (I-) channel and another set of data on a quadrature (Q-) channel. The transmitter generates a gain signal, β, and multiplies the digital data associated with the Q-channel by the gain signal, β. Complexity of the multiplication operation is reduced by limiting the gain signal, β, to a finite number of values that are exactly representable by a predefined number of bits, such as 4-bit values to the right of a binary radix point.

In another aspect of the invention, modulation inaccuracy associated with quantization of β can be eliminated by utilizing the same quantized values of β in all components within the radiocommunications system.

BRIEF DESCRIPTION OF THE DRAWINGS

The objects and advantages of the invention will be understood by reading the following detailed description in conjunction with the drawings in which.

DETAILED DESCRIPTION

Figure 1:
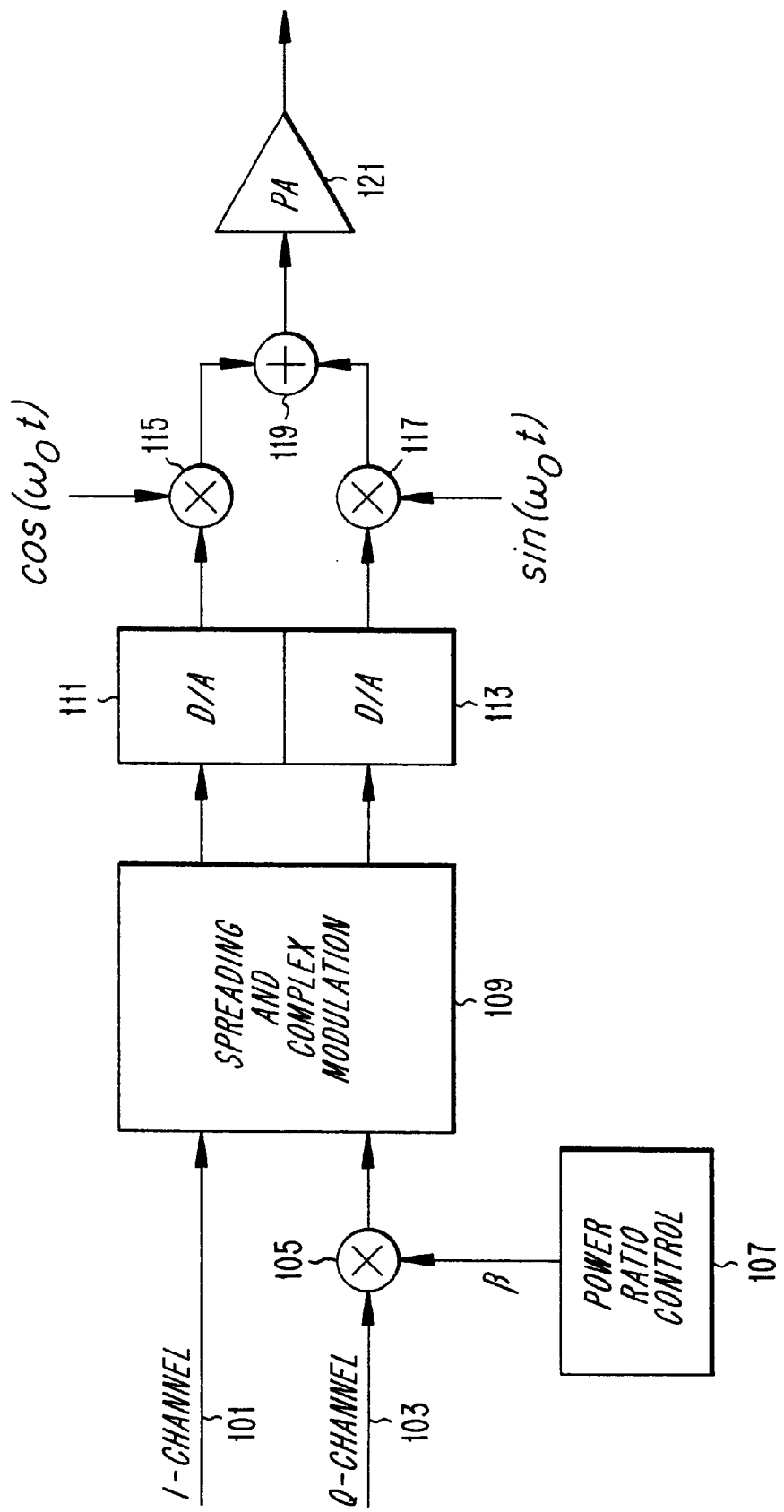
FIG. 1 is a block diagram of a radio communications system transmitter that operates in accordance with one aspect of the invention.

The various features of the invention will now be described with respect to the figures, in which like parts are identified with the same reference characters.

FIG. 1 is a block diagram of a radio communications system transmitter that operates in accordance with the invention. The transmitter employs I and Q channels as described above in the BACKGROUND section. Data samples associated with the Q channel 103 are supplied to one input of a multiplier 105, the other input of which receives a β value from a power ratio control circuit 107. The multiplier 105 multiplies the Q channel data by β for the purpose of power ratio control, as described earlier. The multiplied Q channel data along with data associated with the I-channel 101 are supplied to a spreading and complex modulation circuit 109. The resulting I and Q channel signals are supplied to respective first and second digital to analog (D/A) converters 111, 113. The analog signals supplied by the first and second D/A converters 111, 113 are supplied to respective first and second mixers 115, 117. The first mixer 115 uses a cosine signal for mixing, whereas the second mixer 117 uses a sine signal for mixing. The outputs from the first and second mixers 115, 117 are combined in combining means 119 (e.g., an adder), the output of which is supplied to a power amplifier 121 for amplification prior to transmission.

In accordance with one aspect of the invention, the transmitter further includes a power ratio control unit 107 that generates values for β in a manner that will now be described. The principles upon which the power ratio control unit 107 operates derive, at least in part, from the fact that in a CDMA-like radiocommunications system, all signals are transmitted simultaneously on the same carrier frequency. All signals other than the desired signal are seen as interference in the receiver. When received by the base station, all received signals should have approximately the same energy per transmitted bit in order to minimize the interference from each user and thereby optimize the capacity of the cell.

In the uplink channel of an IQ-modulated scheme such as the above-mentioned WCDMA system, the spreading factor of the Q-channel is set at 256, whereas the spreading factor of the I-channel may be any of the following: 128, 64, 32, 16, 8 and 4. The purpose of the gain factor, β, is to guarantee an optimization of system capacity. In conventional systems, no restrictions are placed on possible values of β (that is, in conventional systems β is specified as a continuous parameter).

The selection of a value for β can have a great impact on system performance. For example, a measure of speed at which information is transmitted in a CDMA system is the "chip rate." In an exemplary system, the primary chip rate can be $f_c$=4.096 Mchip/s, with other chip rates of 1.024, 2.048, 8.192 and 16.384 Mchip/s also being defined for use. Referring to FIG. 1, the digital information signal supplied on the Q-channel 103 may have an oversampling rate ("OS") of 4, with each sample being represented by a number of bits $N_b$. Multiplying each of the resultant samples by β will then require $f_s = f_c \cdot OS = 16.385$ Mops in the 4.096 Mchip/s mode.

Every extra bit in the multiplier (i.e., $N_b$ * number of bits in β) makes each multiplication operation more complex, and in addition adds an extra bit per sample that needs to be transmitted and processed. Consequently, to achieve a power efficient design, the number of bits involved in the multiplication should be minimized. This can be accomplished by restricting β to values that can be accurately represented with a relatively small number of bits. However, as mentioned above, the purpose of the gain factor, β, is to guarantee an optimization of system capacity, and this cannot be accomplished with any arbitrary value of β. Rather, an analysis needs to be performed to determine suitable values of β that can reduce the required computational complexity associated with the multiplication operation, without overly degrading system capacity.

An exemplary analysis is as follows. Assume that in implementations of the exemplary transmitter, β will be in the form of a signal having a finite number of bits. Consequently, where $\beta_{IDEAL}$ represents an "ideal" value that guarantees the optimized system capacity, the β signal represents the ideal value plus some quantization noise that is introduced by approximating the ideal value with a finite number of bits. That is, $\beta = \beta_{IDEAL} + $(quantization noise).

In the exemplary embodiment, values for β are selected by allowing β to exactly represent $\beta_{IDEAL}$ wherever possible (e.g., where $\beta_{IDEAL}$=0.5, and β is represented by at least one bit to the right of the binary radix point), and in all other cases by rounding β up to the next higher representable number. The reason why always rounding up is preferred over rounding to the closest representable number (which may, in some cases, result in rounding down) is because rounding down causes the I over Q power ratio to decrease. As a consequence, the power in the I-channel would have to be increased in order for its performance to be relatively good with respect to that of the Q-channel. With this strategy for selecting β values in mind, the transmitted extra power when the β value is slightly increased can be calculated for a number of candidate representational bit-sizes for β.

Figure 2:
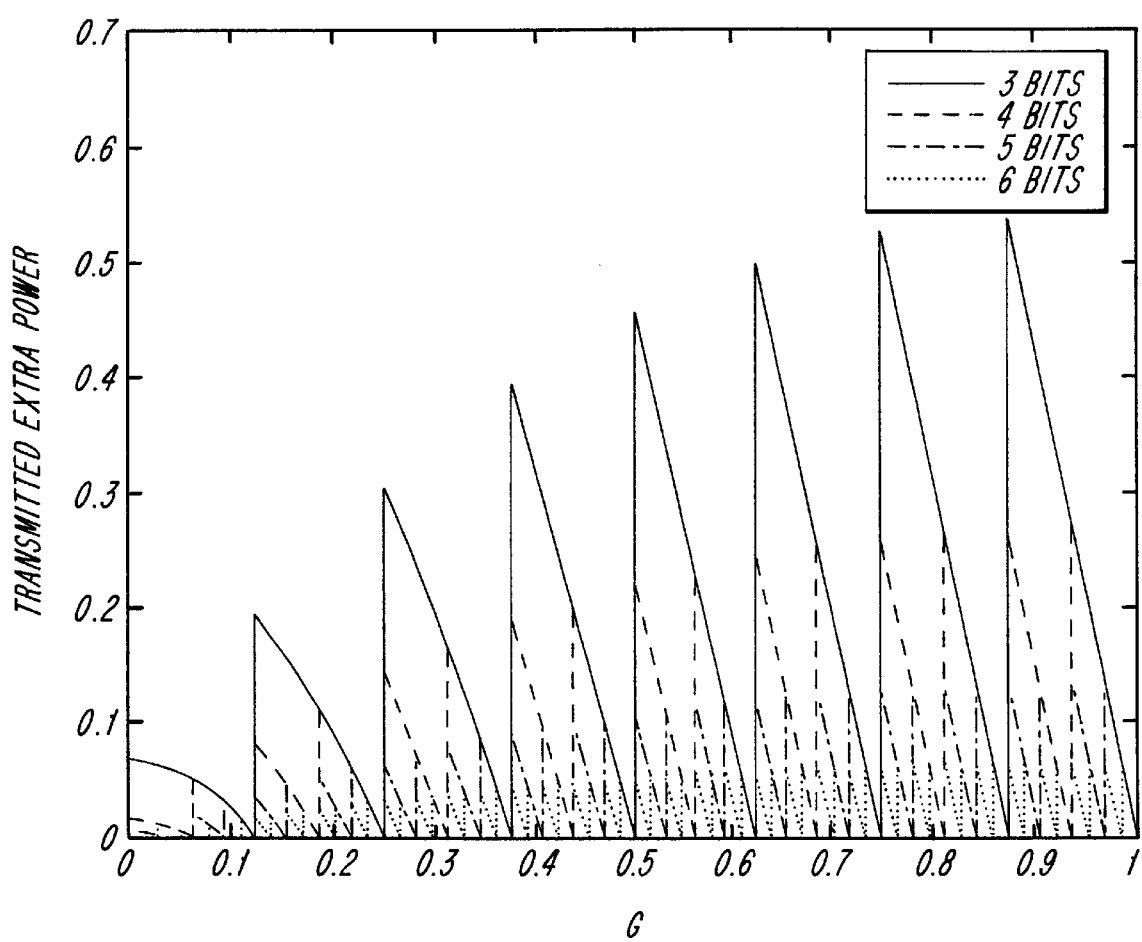
FIG. 2 is a set of graphs depicting, for each of a number of candidate quantization amounts, the required extra transmitted power as a function of the desired gain value β.

FIG. 2 is a set of graphs depicting, for each of a number of candidate quantization amounts (i.e., the number of bits being used to represent β), the required extra transmitted power (in decibels) as a function of the desired β value. Graphs are shown for 3-, 4-, 5- and 6-bit representations of β. It can be seen from the graphs that when a 3-bit representation is used, the worst-case required extra transmitted power is about 0.5 dB. By comparison, when a 4-bit representation is used, the worst-case required extra transmitted power is only 0.25 dB, and in most cases it is much less. As the number of bits used to represent β increases, the amount of required extra transmitted power decreases. In determining which value of β is best to use, another factor that is considered is the minimum step-size for adjustment of transmission power. In many radiocommunications systems, transmission power adjustments can only be made in discrete amounts. In the exemplary WCDMA system, the smallest possible transmission power adjustment is 0.25 dB. Consequently, even though the use of 5- or 6-bit representations of β only requires, at most, approximately 0.12 dB (see FIG. 2) of extra transmission power, the radiocommunications system would, in practice, be forced to increase power by 0.25 dB, because smaller adjustments are impossible. Consequently, it is best to represent β using 4-bit values in this case because using more than 4 bits only increases the multiplication complexity without resulting in any additional transmission power savings.

Figure 3:
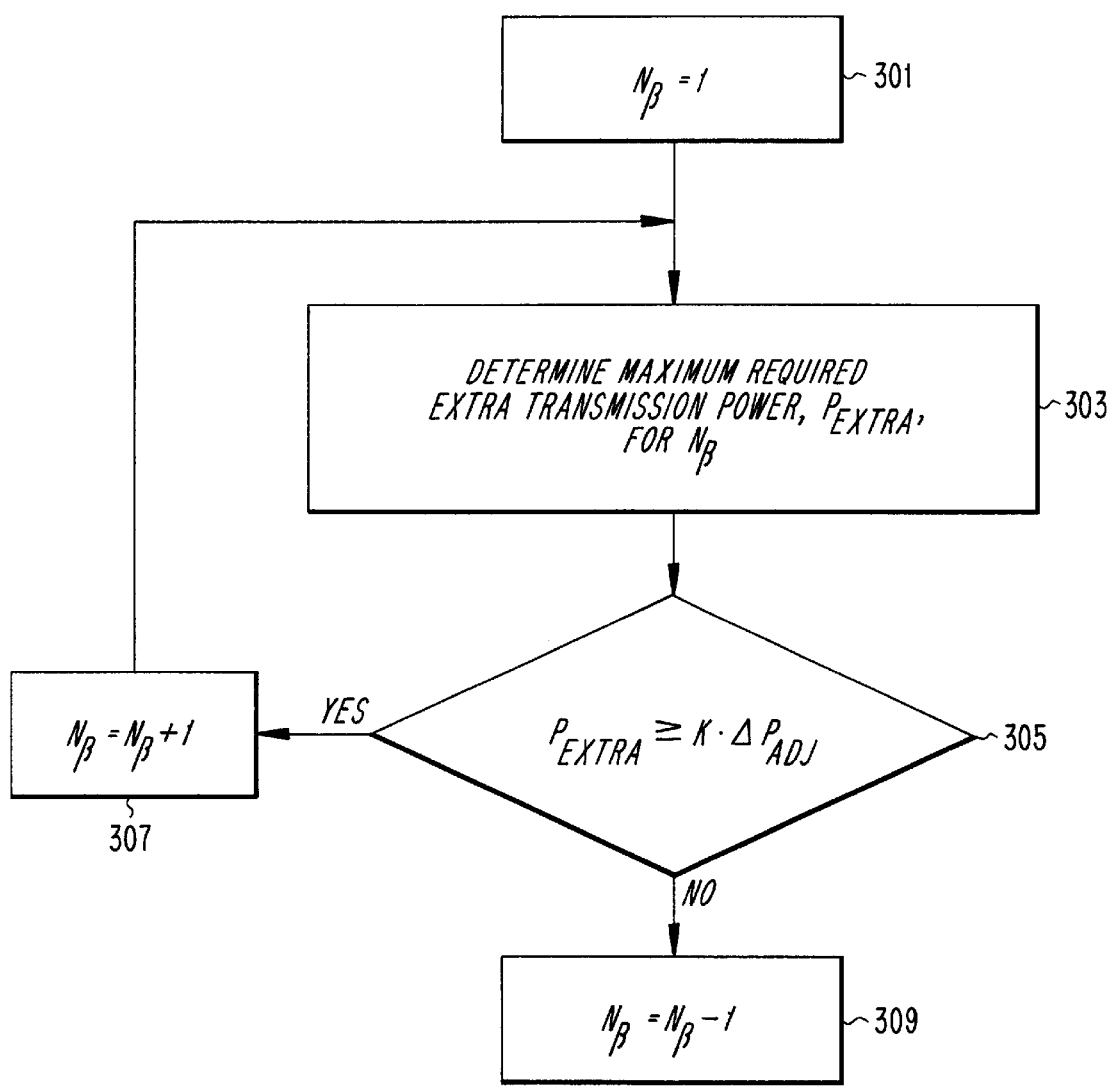
FIG. 3 is a flowchart depicting an exemplary techniques for selecting a β value in accordance with one aspect of the invention.

In view of the above, one embodiment of the invention involves quantizing (i.e., representing) β by that number of bits, $N_\beta$, that results in the lowest maximum required extra transmission power, $P_{EXTRA}$, that does not go below a predetermined multiple, K, of the minimum power adjustment amount, $\Delta P_{ADJ}$. In the example described above, K=1, so that only the smallest possible power adjustment amount will be required as a result of the quantization of β. In some other instances, however, it may be desirable to choose a different value of K where the benefits of keeping $N_\beta$ low outweigh the benefits of further reducing the required extra transmission power. One way of selecting a β value, then, is illustrated in the flowchart of FIG. 3. At step 301, the quantization amount, $N_\beta$, is initialized to the lowest possible value (i.e., 1). Next, $P_{EXTRA}$ is determined as a function of the given $N_\beta$ value (step 303). The value of $P_{EXTRA}$ is then compared to the quantity $K \cdot \Delta P_{ADJ}$ (decision block 305), and if it is greater than or equal ("yes" path out of decision block 305), then the value of $N_\beta$ is incremented by one (step 307). The rationale behind this step is to test another quantization amount to see if the required extra transmission power can be reduced without dropping below the desired minimum of $K \cdot \Delta P_{ADJ}$. After adjusting $N_\beta$, execution is repeated back at step 303.

When a value of $P_{EXTRA}$ is found that is less than $K \cdot \Delta P_{ADJ}$ ("no" path out of decision block 305), then too many bits are being used to represent β. The value of $N_\beta$ is adjusted accordingly back to its previous acceptable level (step 309), and the process of selecting a quantization level for β is complete.

The following Table 1 illustrates an exemplary set of β values that are elected to be close to the data rate ratios. For each ratio, an ideal value, $\beta_{IDEAL}$, is shown, along with the proposed value based on the use of 4-bit representations of β, as determined above.

TABLE 1

| I-channel rate (kbps) | Q-channel rate (kbps) | Ratio of symbol rates in I- and Q-channels | Ideal value, $\beta_{IDEAL}$ | Proposed gain, $\beta$, using 4-bit representation | $\beta$-steps in dB |
|---|---|---|---|---|---|
| 16 | 0 | 0 | 0 | Switch off Q-channel | |
| 16 | 16 | 1 | 1 | 1 | |
| 16 | 32 | 1/2 | 0.707 | 0.75 | 3.52 |
| 16 | 64 | 1/4 | 0.5 | 0.5 | 2.77 |
| 16 | 128 | 1/8 | 0.354 | 0.375 | 2.49 |
| 16 | 256 | 1/16 | 0.25 | 0.25 | 3.52 |
| 16 | 512 | 1/32 | 0.177 | 0.1875 | 2.5 |
| 16 | 1024 | 1/64 | 0.125 | 0.125 | 3.52 |

Figure 4:
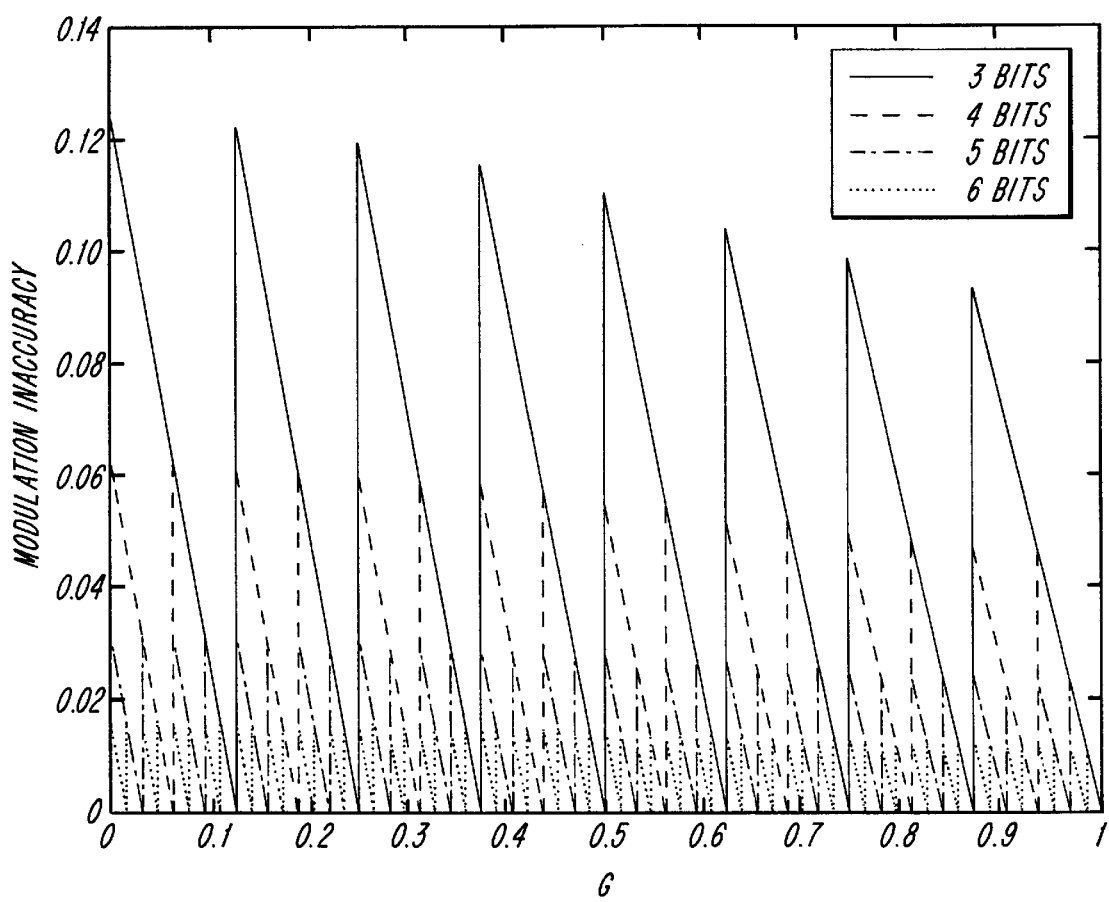
FIG. 4 is a set of graphs showing, for each of a number of quantization levels, the resulting modulation accuracy plotted as a function of the ideal gain parameter, $\beta_{IDEAL}$.

Another factor to consider in selecting an amount of quantization for representing β relates to the effect that this has on modulation inaccuracy. In most cellular telephone systems, for example, standards under which those systems must operate set limits on the amount of modulation inaccuracy that will be acceptable by any given terminal. If a given radiocommunications system operates under a standard that places no restrictions on β values (i.e., the system assumes that $\beta_{IDEAL}$ is being used), then a terminal that utilizes a quantized value of β will exhibit modulation inaccuracy when compared with signals that the system would expect to be generated. FIG. 4 is a set of graphs showing, for each of a number of quantization levels, the resulting modulation inaccuracy plotted as a function of the ideal gain parameter, $\beta_{IDEAL}$. It can be seen that when 4-bit β values are used, the modulation inaccuracy is about 6%. This is a substantial amount of the usual total acceptable modulation inaccuracy, so that serious restrictions would have to be imposed on other components in the radio terminal in order to avoid exceeding the permissible modulation inaccuracy limitations.

In accordance with another aspect of the invention, the problem of modulation inaccuracy resulting from quantization of β is addressed by designing the entire radiocommunications system based on the quantized values of β, rather than on the unrestricted ideal values, $\beta_{IDEAL}$. By requiring each transmitter to use the same, quantized values of β, (e.g., $N_\beta$=4), the system no longer perceives any modulation inaccuracy in connection with this quantization. This has the dual effect of eliminating system mismatches that can occur when different manufacturers quantize differently, while making it easier to design terminals without sacrificing system capacity.

Techniques for selecting values for gain, β, have been described above. In use, these β values would be generated by a power ratio control unit 107, as illustrated in FIG. 1. The power ratio control unit 107 may be implemented, for example, as a digital storage device having stored therein the necessary one or more β values. Preferred criteria for selecting quantized values of β have been described, with a particular value, $N_\beta$=4, being preferred for use in the above-described exemplary WCDMA system. However, it will be recognized by those skilled in the art that other criteria may be used for selecting quantized values of β. For example, one need not always try to find that value of $N_\beta$ that produces the smallest value of $P_{EXTRA}$ that satisfies the relation $P_{EXTRA} \geq K \cdot P_{ADJ}$. Instead, there may be other tradeoffs between modulation accuracy and required extra transmission power that might be desired in other instances. The invention covers these aspects as well.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. An apparatus for use in a transmitter, the apparatus comprising:
   means for receiving digital data associated with an in-phase (I-) channel;
   means for receiving digital data associated with a quadrature (Q-) channel;
   means for generating a gain signal, β;
   means for multiplying the digital data associated with the Q-channel by the gain signal, β,
      wherein the gain signal, β, represents a gain value that is exactly representable by 4-bit signals to the right of a binary radix point.

2. The apparatus of claim 1, wherein the transmitter is for use in a radiocommunications system that requires the use of only those gain values that are exactly representable by 4-bit signals to the right of the binary radix point.

3. The apparatus of claim 1, wherein the gain signal, β, is selected by allowing β to exactly represent an ideal gain value, $\beta_{IDEAL}$, whenever the ideal gain value is exactly representable by 4-bit signals to the right of the binary radix point, and in all other cases by rounding β up to the next higher number that is representable by 4-bit signals to the right of the binary radix point.

4. The apparatus of claim 3, wherein the ideal gain value, $\beta_{IDEAL}$, is a function of a ratio of a data rate of the digital data associated with the I-channel over a data rate of the digital data associated with the Q-channel.

5. A method for use in a transmitter, the method comprising the steps of:
   receiving digital data associated with an in-phase (I-) channel;
   receiving digital data associated with a quadrature (Q-) channel;
   generating a gain signal, β;
   multiplying the digital data associated with the Q-channel by the gain signal, β,
      wherein the gain signal, β, represents a gain value that is exactly representable by 4-bit signals to the right of a binary radix point.

6. The method of claim 5, wherein the transmitter is for use in a radiocommunications system that requires the use of only those gain values that are exactly representable by 4-bit signals to the right of the binary radix point.

7. The method of claim 5, wherein the step of generating a gain signal comprises the steps of:
   selecting the gain signal, β, by allowing β to exactly represent an ideal gain value, $\beta_{IDEAL}$, whenever the ideal gain value is exactly representable by 4-bit signals to the right of the binary radix point, and in all other cases by rounding β up to the next higher number that is representable by 4-bit signals to the right of the binary radix point.

8. The method of claim 7, wherein the ideal gain value, $\beta_{IDEAL}$, is a function of a ratio of a data rate of the digital data associated with the I-channel over a data rate of the digital data associated with the Q-channel.

* * * * *